(12) United States Patent
Smits

(10) Patent No.: US 7,005,781 B2
(45) Date of Patent: Feb. 28, 2006

(54) DEVICES FOR ROTATION USING PIEZOELECTRIC BENDERS

(75) Inventor: J. G. Smits, Stationsstraat 13, 4331 JA Middelburg (NL)

(73) Assignee: J. G. Smits, Middelburg (NL)

( * ) Notice: Subject to any disclaimer, the term of this patent is extended or adjusted under 35 U.S.C. 154(b) by 87 days.

(21) Appl. No.: 10/315,958

(22) Filed: Dec. 11, 2002

(65) Prior Publication Data

US 2004/0113517 A1 Jun. 17, 2004

(51) Int. Cl.
*H01L 41/08* (2006.01)

(52) U.S. Cl. ........................... 310/331; 310/330
(58) Field of Classification Search ................ 310/328, 310/330, 331, 332
See application file for complete search history.

(56) References Cited

U.S. PATENT DOCUMENTS

| 3,816,774 | A | * | 6/1974 | Ohnuki et al. | 310/332 |
| 5,101,278 | A | * | 3/1992 | Itsumi et al. | 348/357 |
| 5,276,672 | A | * | 1/1994 | Miyazaki et al. | 369/126 |
| 5,440,193 | A | * | 8/1995 | Barrett | 310/328 |
| 5,668,432 | A | * | 9/1997 | Tominaga et al. | 310/328 |
| 6,437,485 | B1 | * | 8/2002 | Johansson | 310/332 |

\* cited by examiner

*Primary Examiner*—Mark Budd

(57) ABSTRACT

A construction of benders is disclosed in which benders of single and double lengths are conjoined in a particular manner, which results in constructions in which objects can be rotated but not translated. Three constructions are detailed, one in which an object is rotated over two unit angles alpha, whereas a second construction is disclosed whereby an object is rotated over four unit angles alpha, while a third construction is disclosed in which an object is rotated over eight unit angles alpha. An example is disclosed in which the repeated application of identical units will result in larger rotation angles, still without causing translation.

22 Claims, 6 Drawing Sheets

DEVICES FOR ROTATION USING PIEZOELECTRIC BENDERS

STATEMENT REGARDING FEDERAL FUNDING FOR THIS INVENTION

No federal funding has been involved with the subject of this invention.

BACKGROUND OF THE INVENTIONS

In mechanical constructions, the movements of parts can broadly be classified into two categories: translation and rotation. In many optical applications the redirection of light is a desired condition, such as in scanners, optical switches, in laser printers, bar code readers, projection TV, laser radar, imaging applications, and the like. Mirrors such as those in galvanometric mirror systems that can be rotated are typically fabricated using classical mechanical workshop techniques.

Such techniques cannot easily be implemented into a format in which a rotating mirror construction is fabricated in a set of fabrication methods commonly referred to a MEMS techniques. MEMS is an acronym standing for Micro Electro Mechanical Systems. In MEMS technology the techniques of integrated circuit technologies are applied for the fabrication of mechanical systems.

The current inventions relate to the field of fabricating a rotatable mirror contruction using MEMS techniques. Within the field of rotatable MEMS mirrors systems a unique position is taken by piezoelectrically actuated mirror systems such as the so-called double "J" system by Smits et al.[1]

[1] J. G. Smits, D. C. Brown GSILumonics, Bedford Mass., K Fujimoto, V. K. Kleptsyn, Boston University Boston Mass., S. E. Vargo, D. V. Wiberg, Jet Propulsion Laboratory, Pasadena, Calif., J. T. Evans, G. Z. Velasquez Radiant Technologies, Albuquerque, N. Mex., Dynamic and Static Behavior of Piezoelectric Bimorphs with Extenders in Optical Scanners, Proceedings Ultrasonics Symposium 2000, San Juan, Puerta Rico Working further with the possible applications of piezoelectric benders, we discovered new constructions, which are the subject of the current application.

DESCRIPTION OF THE CURRENT INVENTION

To elucidate the construction of the current inventions, we refer to the paper by Smits et al. (Constituent equations of Piezoelectric Bimorphs, J. G. Smits, S. I. Dalke and T. K. Cooney, Sensors and Actuators, Vol. 28 pp. 41–61, 1991.) In this paper the relations between tip deflection $\delta$ and tip angle $\alpha$ of a piezoelectric bimorph have been defined. Here we use only a small part of the paper namely the part that gives the defining relation between moment M, voltage V, and the tip deflection $\delta$ and tip angle $\alpha$ $$\begin{pmatrix} \alpha \\ \delta \end{pmatrix} = \begin{pmatrix} b_{11} & b_{14} \\ b_{41} & b_{44} \end{pmatrix} = \begin{pmatrix} M \\ V \end{pmatrix} \quad (1)$$

The relation between $\alpha$ and $\delta$ is given as:

$$\alpha = \frac{2\delta}{L},$$

where L is the length of the piezoelectric bender.

We use the term bender here to indicate an element such as a plate or beam that bends under the application of an external stimulus. By this definition, a piezoelectric bimorph under the stimulus of a voltage is a bender but a bimetallic element under the stimulus of a temperature change is also a bender.

The matrix elements b are given in the above named reference. We consider a particular construction, consisting of three benders, namely, of a first bender of a predetermined length L, attached on the first end and free on the second end, a second bender of substantially two times the predetermined length (2L) which is attached with its first end to the second or free end of the first bender, while the second or free end of the second bender is attached to the first end of a third bender. Said third bender has the same predetermined length L as the first bender. In this combination we can drive the first bender with a positive curvature, the second with a negative curvature, and the third again with a positive curvature. This combination of lengths of the three benders, namely L, 2L and L, respectively, together with the signs (positive, negative positive) of the curvatures of the three benders, leads to a condition in which the tip of the third bender, remains at the same location at all times, but undergoes only rotation without translation. The tip rotation of the third bender is $4\alpha$, while its translation is 0.

Alternatively, by reversing the previously mentioned curvatures into respectively negative, positive and negative, we can arrive at a tip rotation of $-4\alpha$. By driving the combination of these three benders with AC voltages with polarities that cause these respective curvatures, we can arrive at AC tip rotations of the tip of the third bender with amplitude of $4\alpha$, but without translation, and without offset. The location of the tip of the third bender is at the clamping point of the first bender, such that an object that is connected to the tip of the third bender is subjected by a moment that is exerted by the tip of the third bender.

We call this unit a Four Alpha Rotator, or alternatively, a single double single unit (SDS unit).

An identical SDS unit of two benders of single length and one bender of double length, mirrored around a symmetry line can be used to complement the original set of three benders, to form a symmetric rotational unit. Disposition of an optical object such as a mirror, or a grating or a prism, between the two tips of the benders of the original set of three benders and the second, mirrored set provides us with a construction that can be integrated, while it can produce an out-of-plane rotation of the object. The object does not simultaneously undergo a translation.

DETAILED DESCRIPTION OF THE DEVICE WITH REFERENCE TO THE FIGURES

Figure 1:
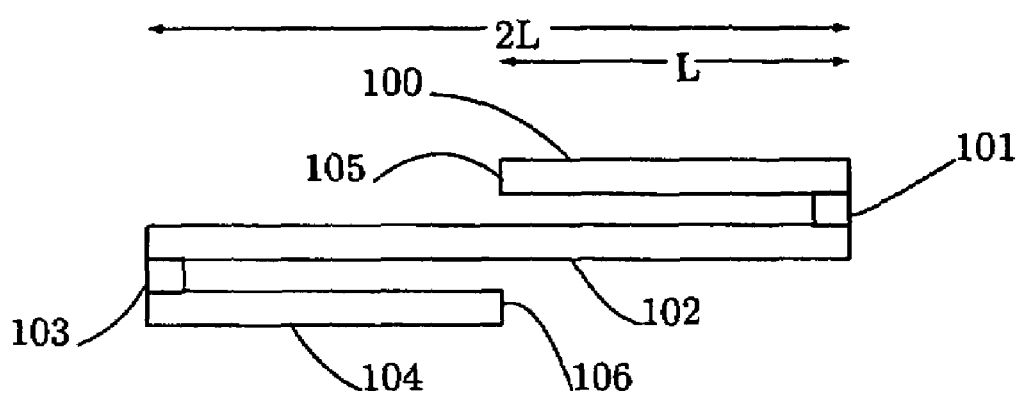
FIG. 1 is a top view of a Four Alpha Rotator.

In FIG. 1 a first bender 100 is shown. It has a reference length L as indicated in FIG. 1. Connected to one end is an attachment piece 101, to which is connected a bender 102 of double the length of the first bender, also called a double bender. Connected to the other end of the double bender is an attachment piece 103, to which is connected a bender 104 of the same length L as the first bender 100.

The end 105 of the first bender is clamped while the end 106 of the third bender is free.

Figure 2:
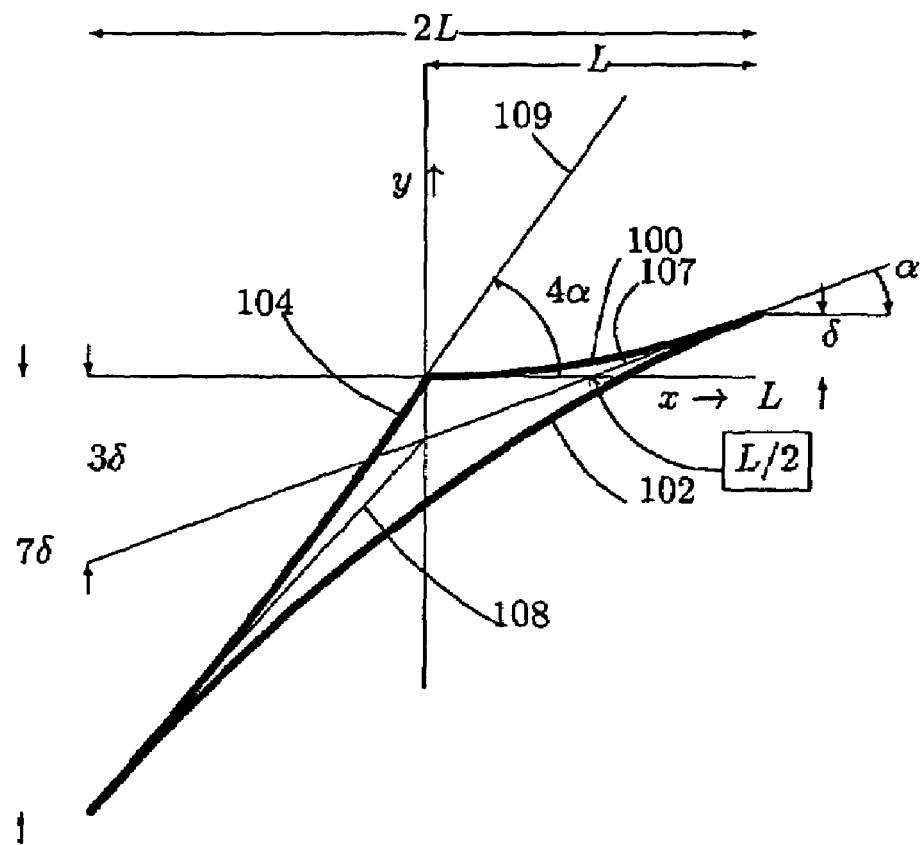
FIG. 2 is a side view of a Four Alpha Rotator.

In FIG. 2 we consider the bending curvatures.

The free end of the first bender 100, which is indicated by a thick line, is raised to a deflection δ and is also rotated over an angle α.

A generalized refererence bender of arbitrary length L has a tip deflection δ and tip angle α, while the relation between tip deflection and angle for small deflections is α=2δ/L.

Going along the x axis in a bender, the deflection increases quadratically with x to a final value δ,1 while the local slope along the bender increases linearly, to a final value α.

Making a bender of otherwise identical properties twice as long as a reference bender, the tip deflection becomes 4δ while the tip angle becomes 2α.

Connected at the tip of bender 100 is the double bender 102 while bender 104 is connected to the tip of 102.

The tangent 107 to the tip intersects the baseline, the x-axis, at L/2 and it intersects the y-axis at δ. At x=−L, the tangent intersects a y -axis at 367 . The slope of tangent 107 is 2δ/L.

Connected to the free end of the first bender is a second bender 102 with a first end and a second end. The second bender 102 has substantially double the length of the first bender, and is sometimes referred to as a double bender. The first end of this second bender is rigidly attached to the free end of the first bender. The second end of the second bender is free to move up and down.

On account of its double length and the quadratic nature of all benders, its tip has a deviation from its baseline of 4δ as opposed to the deflection δ of a bender of single length.

For the double bender 102, the baseline is the tangent 107 to the tip of the first bender.

Where this baseline intersects a y axis at −3δ at x=−L, the extra deviation of 4δ brings the tip of the double bender to −7δ, while at the same time the tip angle of this bender is the accumulated angles of the first and second benders of 3α. The tangent, having a tip slope of 3α=6δ/L and intersecting a y axis at y=−7δ at x=−L, will intersect a y axis at x=0 at −δ.

In this invention a third bender 104 of the same length as the first bender is attached to tip of the double length bender. The baseline of the third bender 104 is the tangent 108 to the tip of the second bender. As the tangent 108 intersects the y-axis at −δ, the extra deviation of magnitude +δ of the third bender will bring the tip of the third bender to an intersection of the y-axis at y=0. At the same time, the angle at the tip of the third bender has accrued to 4α. The angle at the tip of the third bender is the angle between the tangent 109 of the third bender and the x axis.

If all benders are identical in cross section and other properties, while the second bender is always twice as long as the first or third bender, and all respond identical to the application of a voltage, and all are subjected to the same voltage, then regardless of the actual voltage, the tip of the third bender will always be at zero deflection.

Thus we have achieved that the tip of the third bender remains at zero deviation while its tip angle reaches the value 4α. In other words, a condition of pure rotation without translation for the tip of the third bender has been realized. This unique combination of single and double length bender is called a Four Alpha Rotator.

The condition of identical properties of all benders with the exception of their length, can be easily accomplished using MEMS techniques.

The actual voltage shared by all benders might be a time-dependent voltage.

It should be pointed out here, that if the second bender would have been a simple rigid beam of the same dimensions as the second bender, but without being able to bend, the tip of the third bender would still have been at zero deflection, but it would have an angle of 2α. In this description it is assumed that both single length benders are identical, and apart from the sign of their curvature, they move synchronously. In this condition, regardless of the value of the driving voltage, the tip of the third bender will always remain at the origin, while it will rotate.

Figure 3:
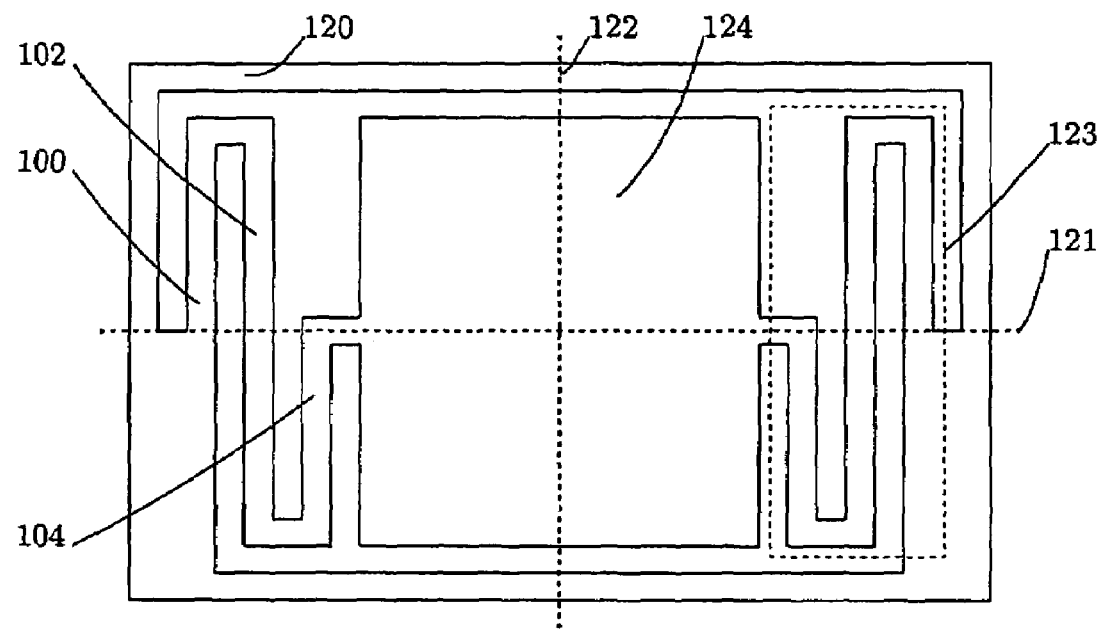
FIG. 3 is a top view of a Eight Alpha Rotator.

In a continuation of this invention as shown in FIG. 3, a second group of three more benders is symmetrically disposed with respect to this first group of three benders, as shown in FIG. 3. Here the original bender 100, of length L is shown again as well as the double length bender 102, of length 2L and the third bender 104 of single length L. A second group of three benders indicated in a dashed line box 123, symmetrically disposed as mirrored around an axis 122 is shown in FIG. 3.

Between the tips of the third benders of the first and second group, an object 124, which could well be a mirror, grating, prism or other optical component, is disposed. The first and second group as well as the object 124 are both encompassed within a common frame 120. The object 124 can be rotated around an axis 121, through the tips of the third benders of the first and second group.

In the previous invention a description was given of a chain of three benders, consisting of a single length bender, bending up, which was concatenated to a double length bender, bending down, which was concatenated to a single length bender, bending up, was described.

This unit of three benders began and ended with single length benders, both bending up. The begin and the end of the chain were both in the origin.

An identical unit of three benders may now be put in series with the first unit of three benders.

The first single length bender, bending up, of this second unit, is now an extension of the third bender of the first unit, also bending up.

Thereby, a seamless junction of the first and second unit can be achieved.

This series connecting of units, consisting of single-double-single length benders, can be repeated indefinitely. As the first unit starts and ends in the origin of the construction, each series connected unit will also start and end in the origin.

A Preffered Embodiment the Eight Alpha Rotator

We can make a construction consisting of a first unit of single-double-single length benders, resulting in an angular rotation of four alpha at the end of the third bender, which is followed by a second unit of single-double-single length benders, giving the total angle as eight alpha.

Figure 4:
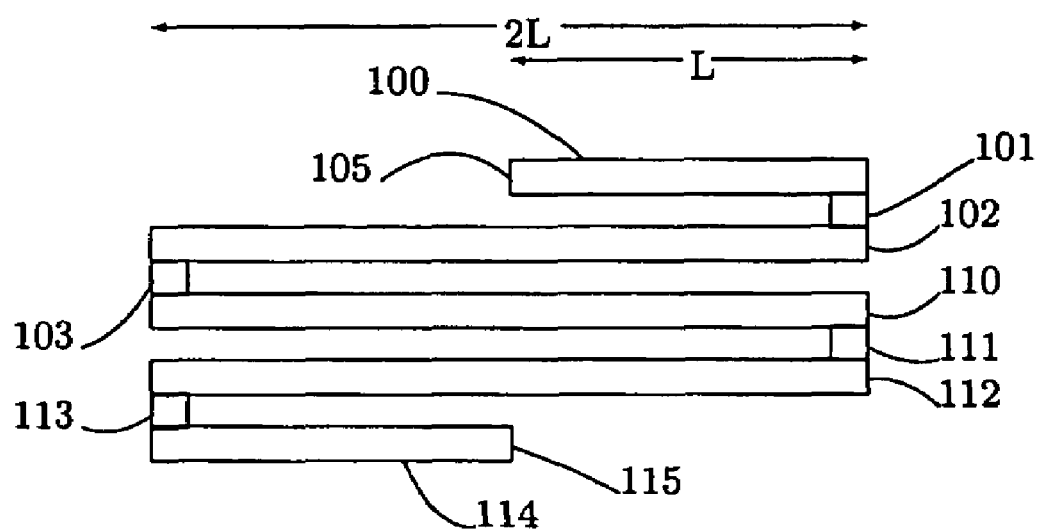
FIG. 4 is a side view of the Eight Alpha Rotator.

This construction is shown in FIG. 4. Here we see again the single length bender 100, as well as the double length bender 102, and the second single length bender 110 which is now extended with the first single length bender of the second group.

The continuation of the single length bender 104 of the first unit with the single length bender of the second unit forms a double length bender 110. This bender is connected by means of attachment piece 111 to the double length bender of the second unit, 112, which in turn is connected through attachment piece 113 with the second single length bender of the second unit, 114.

The resulting tip rotation at the tip of the third bender of the second unit is 8α. After this resulting rotation, we call this construction an Eight Alpha Rotator.

Figure 5:
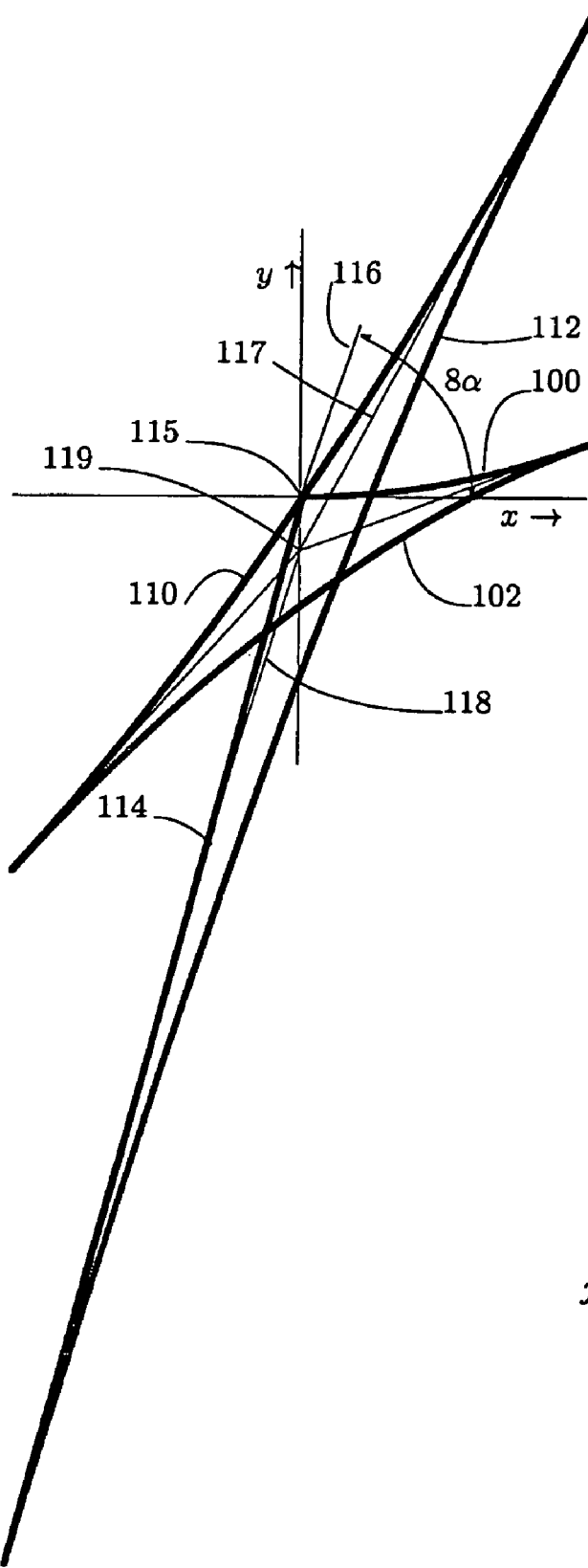
FIG. 5 is a top view of two Four Alpha Rotators supporting a rotatable platform.

In FIG. 5 we show the curving benders of an Eight Alpha Rotator, mulitiplied in the vertical direction with a large factor, for visibility, starting with the first single bender 100 of the first Four Alpha Rotator, continuing with the double bender 102 and going further with the merged union 110 of the third single bender of the first Four Alpha Rotator and the first single bender of the second Four Alpha Rotator. Next we have the double bender 112 of the second Four Alpha Rotator, followed by the third bender, 114—a single bender—of the second Four Alpha Rotator.

The free tip 115 of the bender 114 is located back in the origin.

The tip angle of 114 at the origin is the angle between the tangent 116 to the free tip and the x axis.

The tangent 117 to the tip of the merged union of the single benders 110, intersects the y axis at −δ, The tangent 118 to the tip of the double bender 112 also intersects the y axis at −δ.

Therefore, the tangents 107, 108, 117 and 118 all intersect in the point (x=0,y=−δ) at 119.

Figure 6:
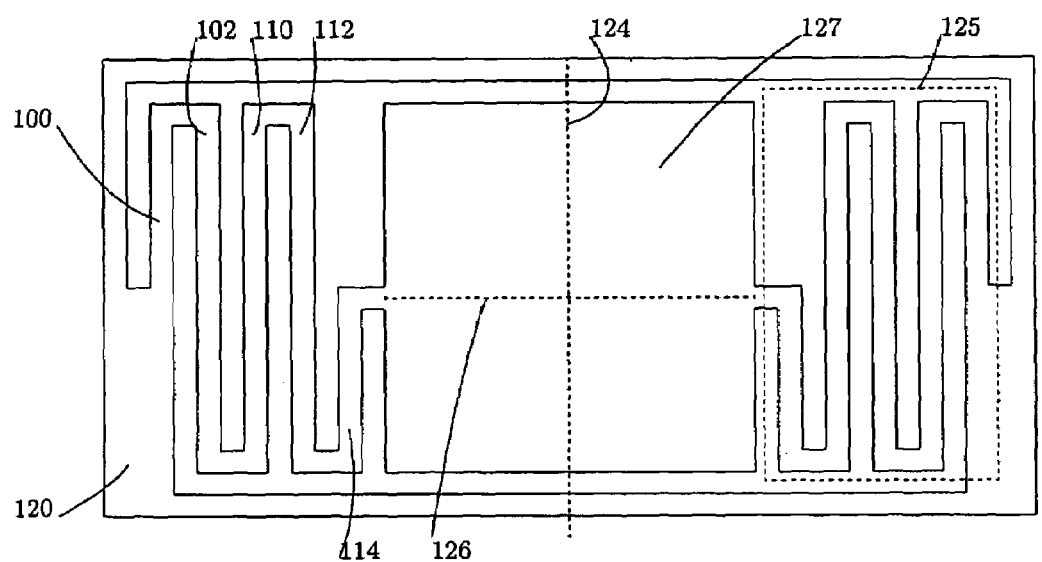
FIG. 6 is a top view of two Eight Alpha Rotators supporting a rotatable platform

An example of an application of an Eight Alpha Rotator is given in FIG. 6.

The benders 100, 102, 110, 112 and 114 are given on the left side of the figure. A mirror line 124 is given in the center of the figure, where a mirror image of the Eight Alpha Rotator is given on the right inside the dashed box 125. The axis of rotation 126 is shown of an object 127, which could be an optical mirror, grating, prism or any other object.

The above mentioned examples are merely mentioned as objects that are rotated, but the list of examples is not meant to indicate that the described invention is exclusively dedicated to optical applications.

What is claimed is:

1. A construction consisting of
   (a) a first bender of a predetermined length with a predetermined curvature, with a first end and a second end, of which the first end is rigidly clamped and the second end is free to move, whereas connected laterally to the second end of the first bender is
   (b) a second bender with a length equal to substantially twice the length of the first bender whereas its curvature is the opposite of that of the first bender, this second bender having a first and second end, where the first end of the second bender is rigidly attached to said second end of said first bender while said second end of said second bender is free to move, whereas connected laterally to the second end of the second bender is
   (c) a third bender with a length, substantially equal to the same predetermined length as said first bender while it has the same curvature as the first bender, said third bender having a first end and a second end, while said first end of said third bender is rigidly attached to said second end of said second bender, and said second end of said third bender is free to move.

2. The construction of three benders with predetermined lengths as in claim 1, in which
   (a) the first bender has a predetermined curvature,
   (b) the second bender is a rigid body without curvature
   (c) the third bender has the same predetermined curvature as the first bender.

3. A construction consisting of two units, each unit made up of the construction of claim 1, said two units arranged as mirror images of each other, whereas the tips of the third benders of said two units are connected by a body which can undergo rotation.

4. The construction of claim 1 augmented with a second and identical construction, whereby the first bender of the second construction forms an extension of the third bender of the first unit, such that the merged union of the third bender of the first unit with the first bender of the second unit has the same predetermined length as the second bender of the first unit.

5. A rotation device consisting of a construction of two units as in claim 4, whereby said two units are mirror images of each other with respect to a mirror plane, said plane intersecting an object that is suspended from the third benders of both units, such an object being rotatable and undergoing rotation without translation.

6. A construction consisting of two units, each unit made up of the construction of claim 2, said two units arranged as mirror images of each other, whereas the tips of the third benders of said two units are connected by a body which can undergo rotation.

7. The construction of claim 2 augmented with a second and identical construction, whereby the first bender of the second construction forms an extension of the third bender of the first unit, such that the merged union of the third bender of the first unit with the first bender of the second unit has the same predetermined length as the second bender of the first unit.

8. A rotation device consisting of a construction of two units as in claim 7, whereby said two units are each other's mirror images with respect to a mirror plane, said plane intersecting an object that is suspended from the third benders from the second units, such an object being rotatable and undergoing rotation without translation.

9. The construction of claim 1, whereby the construction is fabricated using micro-electromechanical systems fabrication methods.

10. The construction of claim 1, whereby said benders are piezoelectrically actuated bending elements.

11. The construction of claim 1 whereby the construction is fabricated using piezoelectric materials.

12. The construction of claim 1 whereby the construction is fabricated from piezoelectric PZT.

13. The construction of claim 1 whereby said benders consist of a layer of piezoelectric material on a nonpiezoelectric substrate.

14. The construction of claim 1 whereby layers of differently polarized piezoelectric materials are used.

15. The construction of claim 1 whereby said benders consist of a piezoelectric material on silicon.

16. The construction of claim 1 whereby the bender consist of a piezoelectric material on silicon, whereas the piezoelectric material is any material from the following groups of materials:
   (a) The homologs of polyvinylidene fluoride,
   (b) The materials made up from the so called II-VI elements,
   (c) The materials made up from the so called III-V elements
   (d) Ferroelectric Relaxor materials
   (e) Electrostrictive materials (f) Perovskites
(g) Homologs of Rochelle Salt
(h) Homologs of Ethylene Diamine Tartrate
(i) Homologs of Ammonium Dihydrogen Sulphate
(j) Homologs of Quartz.

17. The construction of claim 1 whereby said benders are bending elements actuated by shape memory alloys.

18. The construction of claim 1 whereby said benders are bending elements actuated by electrostatic forces.

19. The construction of claim 1 whereby said benders are bending elements actuated magnetically.

20. The construction of claim 1 whereby said benders are bending elements actuated thermally by heating of bending elements comprised of materials with unequal thermal expansion coefficients.

21. The construction of claim 1 whereby said benders are bending elements actuated thermally by non uniform heating of bending elements.

22. The construction of claim 1 whereby said benders are bending elements actuated by non-piezoelectric electrostrictive materials.

* * * * *